United States Patent [19]

Lee et al.

[11] Patent Number: 5,656,822

[45] Date of Patent: Aug. 12, 1997

[54] THIN FILM TRANSISTOR HAVING INCREASED EFFECTIVE CHANNEL WIDTH

[75] Inventors: Kuo-Hua Lee; Chun-Ting Liu, both of Wescosville, Pa.

[73] Assignee: Lucent Technologies Inc., Murray Hill, N.J.

[21] Appl. No.: 520,087

[22] Filed: Aug. 28, 1995

Related U.S. Application Data

[63] Continuation of Ser. No. 175,909, Dec. 30, 1993, abandoned.

[51] Int. Cl.$^6$ .............. H01L 29/04; H01L 31/036; H01L 31/0376; H01L 31/20
[52] U.S. Cl. .............................. 257/56; 257/347
[58] Field of Search .......................... 257/60, 61, 56, 257/347, 328

[56] References Cited

U.S. PATENT DOCUMENTS

| | | | |
|---|---|---|---|
| 4,720,736 | 1/1988 | Takafugi et al. | 257/61 |
| 5,115,289 | 5/1992 | Hisamoto et al. | 257/347 |
| 5,202,572 | 4/1993 | Kobayashi | 257/61 |
| 5,283,455 | 2/1994 | Inoue et al. | 257/347 |

FOREIGN PATENT DOCUMENTS

| | | | |
|---|---|---|---|
| 62-120076 | 6/1987 | Japan | 257/60 |
| 2-260460 | 10/1990 | Japan | 257/61 |

*Primary Examiner*—Stephen Meier

[57] ABSTRACT

The longitudinal edges of the overlying channel layer of a thin-film transistor are substantially aligned with the longitudinal edges of the underlying polysilicon gate layer. As a result of this line-on-line arrangement of the channel and gate layers, integration area is minimized so that optimum integration density is achieved. Source-to-drain on current is increased as the result of the increased channel width gained from the sidewall section of the polysilicon gate, which may occur as a result of the permissible lateral extension of the body (channel) layer over one longitudinal edge of the channel gate layer due to a misalignment in lithography or processing delta.

2 Claims, 1 Drawing Sheet

THIN FILM TRANSISTOR HAVING INCREASED EFFECTIVE CHANNEL WIDTH

This is a continuation of application Ser. No. 08/175,909 filed Dec. 30, 1993, now abandoned.

TECHNICAL FIELD OF THE INVENTION

The present invention relates generally to thin film transistors (TFTs), and more particularly to a TFT having an increased effective channel width.

BACKGROUND OF THE INVENTION

In recent years, thin-film transistors have become used with increasing frequency in numerous applications such as the data-storing elements in high-density SRAMs. As described in, for example, "An Experimental Study on the Short-Channel Effects in Undergated Polysilicon Thin-Film Transistors With and Without Lightly Doped Drain Structures," by Chun Ting Liu and K. H. Lee, IEEE Electronic Device Letters, Vol. 14, No. 3, March 1993, a TFT typically includes a doped amorphous silicon or polysilicon gate formed on an oxide substrate. An oxide layer overlies the gate and an amorphous silicon channel layer overlies the gate oxide layer. The outer extensions of the chemical layer are doped to form drain and source regions. An application of a control voltage to the gate electrode causes electron current flow to occur in the overlying silicon channel layer between the source and drain regions.

In the fabrication of TFTs it has long been the conventional understanding that the polysilicon gate must be wider than the overlying amorphous silicon body or channel layer so that portions of the gate layer extend beyond the longitudinal edges of the silicon film. This is done in order to ensure that the entire amorphous silicon channel layer overlies the underlying gate layer. This design tolerance, which is required in current design rules for fabricating TFTs, increases the spacing between adjacent TFTs and thus increases, for example, the size of the SRAM cell site and reduces integration density.

It is therefore an object of the present invention to provide a TFT having an increased effective channel width.

It is a further object of the present invention to provide a TFT requiring a reduced lateral dimension, thereby increasing integration density in integrated circuits that include such devices.

In accordance with the present invention, the longitudinal edges of the overlying amorphous silicon channel layer of a thin-film transistor are substantially aligned with the longitudinal edges of the underlying polysilicon gate layer. As a result of this line-on-line arrangement of the channel and gate layer, integration area of the transistor is minimized and the spacing between adjacent transistors can be minimized so that optimum integration density can be achieved. In addition, source-to-drain current is increased as the result of the increased channel width gained from the sidewall section of the polysilicon gate, which may occur as a result of the permissible lateral extension of the body (channel) layer over one longitudinal edge of the channel gate layer due to a misalignment in lithography or processing delta.

BRIEF DESCRIPTION OF THE DRAWINGS

Further advantages and features of the present invention will become more apparent from the description of an illustrative embodiment thereof, taken in conjunction with the accompanying drawings, in which.

DETAILED DESCRIPTION OF THE INVENTION

Figure 1:
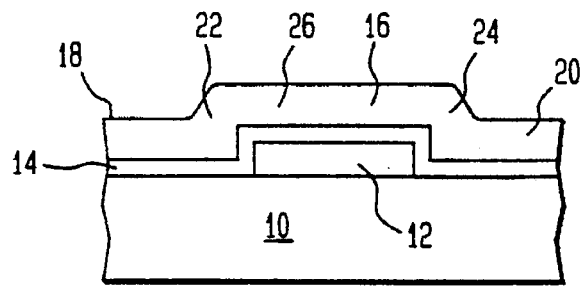
FIG. 1 is a cross-section of a conventional thin-film transistor.
Figure 2:
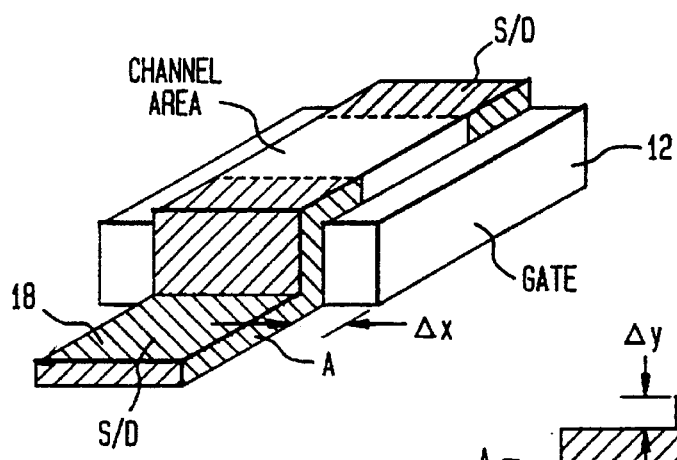
FIG. 2 is a perspective view of a conventional thin-film transistor.
Figure 3:
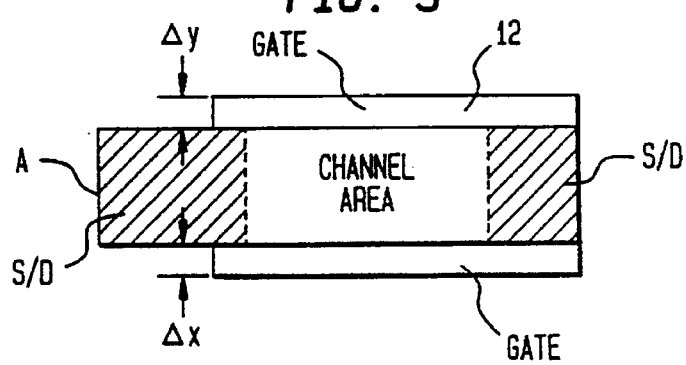
FIG. 3 is a plan view of the prior art thin-film transistor of FIGS. 1 and 2.

As illustrated in FIGS. 1–3, a conventional thin-film transistor (TFT) includes a silicon oxide substrate 10 on which is formed a polysilicon or amorphous silicon gate electrode 12. A gate oxide layer 14 overlies the gate electrode 12 and substrate 10, and an amorphous silicon layer 16 extends over the gate oxide layer 14. The opposite ends of amorphous silicon layer 16 are doped to form source/drain regions 18, 20, the undoped portion of layer 16 defining the channel area 26 of the transistor. The amorphous silicon layer 16 may be lightly doped inwardly of the source drain regions to form lightly doped drain (LDD) regions as at 22, 24.

As can be seen in FIGS. 2 and 3, in the fabrication of the conventional TFT illustrated there, it has heretofore been regarded as necessary to extend the polysilicon gate electrode 12 transversely to the overlying channel layer 16 in the x-direction by the amount shown in the figures as $\Delta x$, as a design rule, in order that there be a portion of the polysilicon gate electrode 12 underlying the entire width of the channel area 26, even in the event of a misalignment in the lithographic process used to fabricate the transistor.

Figure 4:
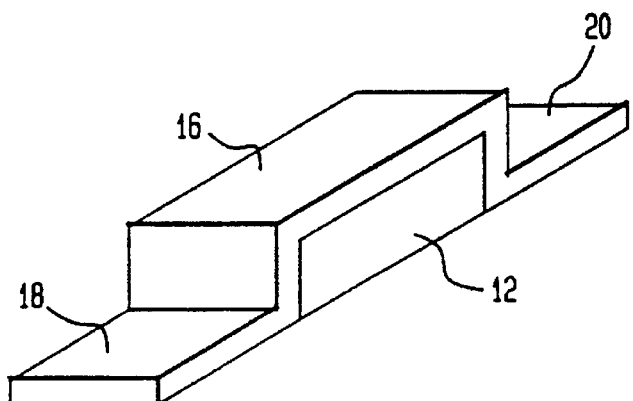
FIG. 4 is a perspective view of a thin-film transistor in accordance with an embodiment of the present invention.
Figure 5:
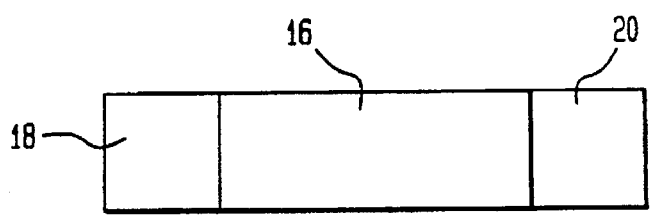
FIG. 5 is a plan view of the thin-film transistor of FIG. 4.

The present invention, as illustrated in FIGS. 4 and 5, is contrary to the conventional design, in that no lateral extension of the polysilicon gate electrode 12 with respect to the channel area 26 is provided so that the value of $\Delta x$ can be made zero. That is, the channel area 26 of the TFT, according to the present invention, is made line-on-line with respect to the underlying polysilicon gate electrode 12 in the longitudinal direction.

It has been found that even if there is a misalignment between the gate electrode 12 and channel area 26 the on current $I_{on}$ is greater than in the conventional TFT of FIGS. 1–3, because of the increased effective channel width achieved in the TFT of the present invention by the utilization of the sidewalls of the underneath polysilicon gate electrode. The line-on-line arrangement of the TFT of FIGS. 4 and 5 also produces optimum integration density by reducing the necessary lateral spacing between adjacent TFTs.

Although the present invention is described hereinabove with respect to a presently preferred embodiment, it will be recognized that modifications may be made therein without necessarily departing from the spirit and scope of the invention.

What is claimed is:

1. A thin film transistor, comprising:

a substrate, a polysilicon gate electrode layer including first longitudinal edges overlying said substrate, and an amorphous silicon layer including an undoped control channel area having second longitudinal edges overlying said gate electrode layer, the first longitudinal edges of said gate electrode layer being in substantial alignment with the second longitudinal edges of the undoped control channel area, thereby increasing an effective channel width of the thin film transistor.

2. The thin-film transistor of claim 1, in which said amorphous silicon layer includes opposing ends which are doped to form spaced source and drain regions.

* * * * *